United States Patent
Mitsuya et al.

(10) Patent No.: US 7,863,814 B2
(45) Date of Patent: Jan. 4, 2011

(54) ORGANIC ELECTROLUMINESCENT DEVICE COMPRISING A STACK PARTITION STRUCTURE

(75) Inventors: Masayuki Mitsuya, Chino (JP); Koji Yasukawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 385 days.

(21) Appl. No.: 12/106,000

(22) Filed: Apr. 18, 2008

(65) Prior Publication Data
US 2008/0303424 A1    Dec. 11, 2008

(30) Foreign Application Priority Data

Apr. 25, 2007 (JP) .............................. 2007-115137
Apr. 25, 2007 (JP) .............................. 2007-115138

(51) Int. Cl.
*H01L 51/00* (2006.01)
*H01L 51/50* (2006.01)
*H01L 51/52* (2006.01)
*H01L 51/54* (2006.01)

(52) U.S. Cl. ...................... 313/509; 313/503; 313/504; 313/506

(58) Field of Classification Search .......... 313/498–512
See application file for complete search history.

(56) References Cited

U.S. PATENT DOCUMENTS

| | | | | |
|---|---|---|---|---|
| 5,701,055 A | * | 12/1997 | Nagayama et al. | 313/504 |
| 7,683,537 B2 | * | 3/2010 | Yoshida et al. | 313/509 |
| 7,692,186 B2 | * | 4/2010 | Yamazaki et al. | 257/40 |
| 2003/0076608 A1 | * | 4/2003 | Yudasaka | 359/885 |
| 2004/0195205 A1 | * | 10/2004 | Yudasaka | 216/23 |
| 2006/0158111 A1 | * | 7/2006 | Hayashi | 313/512 |
| 2006/0197441 A1 | * | 9/2006 | Tsai et al. | 313/506 |
| 2007/0075618 A1 | * | 4/2007 | Mitsuya | 313/292 |
| 2007/0159068 A1 | * | 7/2007 | Miyake | 313/504 |

FOREIGN PATENT DOCUMENTS

| | | |
|---|---|---|
| JP | A-05-275172 | 10/1993 |
| JP | A-2005-216714 | 8/2005 |
| WO | WO 2004107821 A1 * | 12/2004 |

* cited by examiner

*Primary Examiner*—Sikha Roy
*Assistant Examiner*—Jose M Diaz
(74) *Attorney, Agent, or Firm*—Oliff & Berridge PLC

(57) ABSTRACT

An organic electroluminescent device includes a substrate on which a pixel region is disposed, and a partition structure including a stack of an inorganic partition made of an inorganic material and an organic partition made of an organic material, and an inorganic protective layer made of an inorganic material covering the surfaces of the organic partition. The partition structure surrounds the pixel region. A pixel electrode is in contact with the partition structure. An organic luminescent layer is disposed over the pixel electrode and covered with a cathode.

6 Claims, 11 Drawing Sheets

ORGANIC ELECTROLUMINESCENT DEVICE COMPRISING A STACK PARTITION STRUCTURE

CROSS REFERENCES TO RELATED APPLICATIONS

The present invention contains subject matter related to Japanese Patent Application Nos. 2007-115137 and 2007-115138 filed in the Japanese Patent Office on Apr. 25, 2007, the entire contents of which are incorporated herein by reference.

BACKGROUND

1. Technical Field

The present invention relates to an organic electroluminescent device.

2. Related Art

An organic EL device including electroluminescent elements (hereinafter referred to as organic EL elements) is thought of as a display device including self-light-emitting elements not requiring a light source, such as a backlight.

A known organic EL device includes switching elements (for example, TFT elements) formed on a substrate, a planarizing layer reducing the unevenness resulting from the formation of the TFT elements, pixel electrodes formed on the planarizing layer corresponding to respective pixel regions and electrically connected to the TFT elements, a cathode, and an organic luminescent layer disposed between the pixel electrodes and the cathode. In this structure, the planarizing layer has contact holes through which the pixel electrodes and the TFT elements are electrically connected.

Japanese Unexamined Patent Application Publication No. 5-275172 discloses an organic EL device including a partition that prevents the pixel electrodes of adjacent pixel regions from coming into contact with each other or prevents the pixel electrode from coming into contact with the cathode. The partition is made of the same material as the planarizing layer, such as acrylic resin or polyimide.

In the manufacture of an organic EL devicer the pixel electrode, which may be made of ITO (indium tin oxide), is subjected to plasma treatment to clean the surface to remove soil before forming the organic luminescent layer on the pixel electrode.

However, plasma treatment partially etches the acrylic resin or polyimide of the partition and deposits foreign matter on the pixel electrode. Thus, the surface of the pixel electrode may be contaminated, and consequently the light-emitting characteristics are degraded.

Accordingly, in Japanese Unexamined Patent Application Publication No. 2005-216714, the organic material of the partition is improved to prevent the problems resulting from plasma treatment.

In order to favorably remove soil from the surface of the pixel electrode, high-intensity plasma treatment is desired.

However, the partition material disclosed in Japanese Unexamined Patent Application Publication No. 2005-216714 is an organic material, and organic materials have a limitation in resistance to plasma. Thus, the organic material of the partition does not have a sufficient resistance to plasma.

Accordingly, the plasma intensity is reduced, and consequently the surface of the pixel electrode cannot be sufficiently cleaned. On the contrary, the partition undergoes plasma treatment with exposure to plasma beyond the resistance, thus contaminating the surface of the pixel electrode. Consequently, the light-emitting characteristics of the organic EL device may be degraded.

SUMMARY

An advantage of some aspects of the invention is that it provides an organic electroluminescent device in which problems resulting from plasma surface treatment are prevented to exhibit superior light-emitting characteristics over a long time.

According to an aspect of the invention, an organic electroluminescent device is provided which includes a substrate on which a pixel region is disposed, and a partition structure. The partition structure includes a stack of an inorganic partition made of an inorganic material and an organic partition made of an organic material, and an inorganic protective layer made of an inorganic material covering the surfaces of the organic partition. The partition structure surrounds the pixel region. The organic electroluminescent device also includes a pixel electrode in contact with the partition structure, an organic luminescent layer disposed over the pixel electrode, and a cathode covering the organic luminescent layer.

In the organic electroluminescent device, the surfaces of the organic partition are covered with the inorganic protective layer. The inorganic protective layer prevents the organic partition from being damaged even though the surface of the pixel electrode is cleaned by plasma treatment for forming the organic luminescent layer.

Thus, the contamination of the pixel electrode can be prevented, which is caused by deposition on the pixel electrode of foreign matter resulting from the plasma treatment that may partially etch the organic partition.

Therefore, the organic luminescent layer can be favorably formed on the pixel electrode, and the resulting organic electroluminescent device can exhibit superior light-emitting characteristics over a long time.

Preferably, the inorganic protective layer mainly contains a compound selected from the group consisting of SiO, $SiO_2$, SiON, SiN, AlO, AlN, and $Al_2O_3$.

Consequently, the inorganic protective layer can appropriately prevent the organic partition from being damaged even though plasma treatment is performed.

Preferably, the inorganic protective layer has a thickness in the range of 50 to 200 nm.

An inorganic protective layer having a thickness of 50 nm or more is sufficiently resistant to plasma. An inorganic protective layer having a thickness of 200 nm or less does not cause crack or breakage, which can be caused by an excessively large thickness.

Preferably, the organic luminescent layer is formed by a gas phase process.

Thus, the organic luminescent layer is favorably formed by a gas phase process, such as vapor deposition, on the pixel electrode not contaminated by the cleaning treatment. Consequently, the resulting organic electroluminescent device can exhibit highly reliable and superior light-emitting characteristics.

Preferably, the organic partition has inclined surfaces forming a tapered shape in sectional view.

The tapered inclined surfaces of the organic partition increase the adhesion to the organic luminescent layer when the organic luminescent layer is formed over the entire surface of the substrate by, for example, vapor deposition.

Thus, the cathode overlying the organic luminescent layer is also formed along the taper surfaces, and consequently, disconnection can be prevented.

According to another aspect of the invention, an organic electroluminescent device is provided which includes a substrate, a planarizing layer made of an organic material on the substrate, a pixel electrode disposed on the planarizing layer, an inorganic partition disposed on the planarizing layer so as to cover the upper edge of the pixel electrode and having a first aperture in which the planarizing layer is exposed, an organic partition disposed on the inorganic partition and in contact with the planarizing layer through the first aperture, an inorganic protective layer covering the organic partition and having a second aperture in which the organic partition is exposed, an organic luminescent layer disposed on the pixel electrode, and a cathode disposed on the organic luminescent layer.

In this organic electroluminescent device, the surface of the organic partition is covered with the inorganic protective layer. The inorganic protective layer prevents the organic partition from being damaged even though the surface of the pixel electrode is cleaned by plasma treatment for forming the organic luminescent layer.

Thus, the contamination of the pixel electrode can be prevented, which is caused by deposition on the pixel electrode of foreign matter resulting from the plasma treatment that may partially etch the organic partition.

In addition, gas generated from the planarizing layer and the organic partition in contact with the planarizing layer through the first aperture during the formation of the organic luminescent layer can be released to the outside through the second aperture formed in the inorganic protective layer.

Outgassing is thus prevented during the operation of the organic electroluminescent device, and thus, emission failure resulting from outgassing can be prevented. Consequently, the resulting organic electroluminescent device is highly reliable.

Preferably, the second aperture is formed in a region corresponding to the upper surface of the organic partition.

Thus, the pixel electrode can be more distant from the second aperture than from the side surfaces of the organic partition. Accordingly, the possibility of the damage to the organic partition exposed in the second aperture from plasma treatment can be reduced when plasma treatment is performed for cleaning the surface of the pixel electrode.

Preferably, the second aperture covers at least part of the first aperture when viewing the substrate from above.

This structure allows the gas generated from the planarizing layer and permeated into the organic partition through the first aperture to be easily released to the outside together with the gas generated from the organic partition through the second aperture.

Thus, undesired gas can be efficiently released to the outside.

Preferably, the inorganic protective layer mainly contains a compound selected from the group consisting of SiO, $SiO_2$, SiON, SiN, AlO, AlN, and $Al_2O_3$.

Thus, the inorganic protective layer can prevent the organic partition from being damaged by plasma treatment effectively.

Preferably, the inorganic protective layer has a thickness in the range of 50 to 200 nm.

An inorganic protective layer having a thickness of 50 nm or more is sufficiently resistant to plasma.

An inorganic protective layer having a thickness of 200 nm or less does not cause crack or breakage, which can be caused by an excessively large thickness.

Preferably, the organic luminescent layer is formed by a gas phase process.

Thus, the organic luminescent layer is favorably formed by a gas phase process, such as vapor deposition, on the pixel electrode not contaminated by the cleaning treatment. Consequently, the resulting organic electroluminescent device can exhibit highly reliable and superior light-emitting characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

An organic electroluminescent device (hereinafter referred to as organic EL device) according to a first embodiment of the invention will now be described with reference to the drawings.

Figure 1:
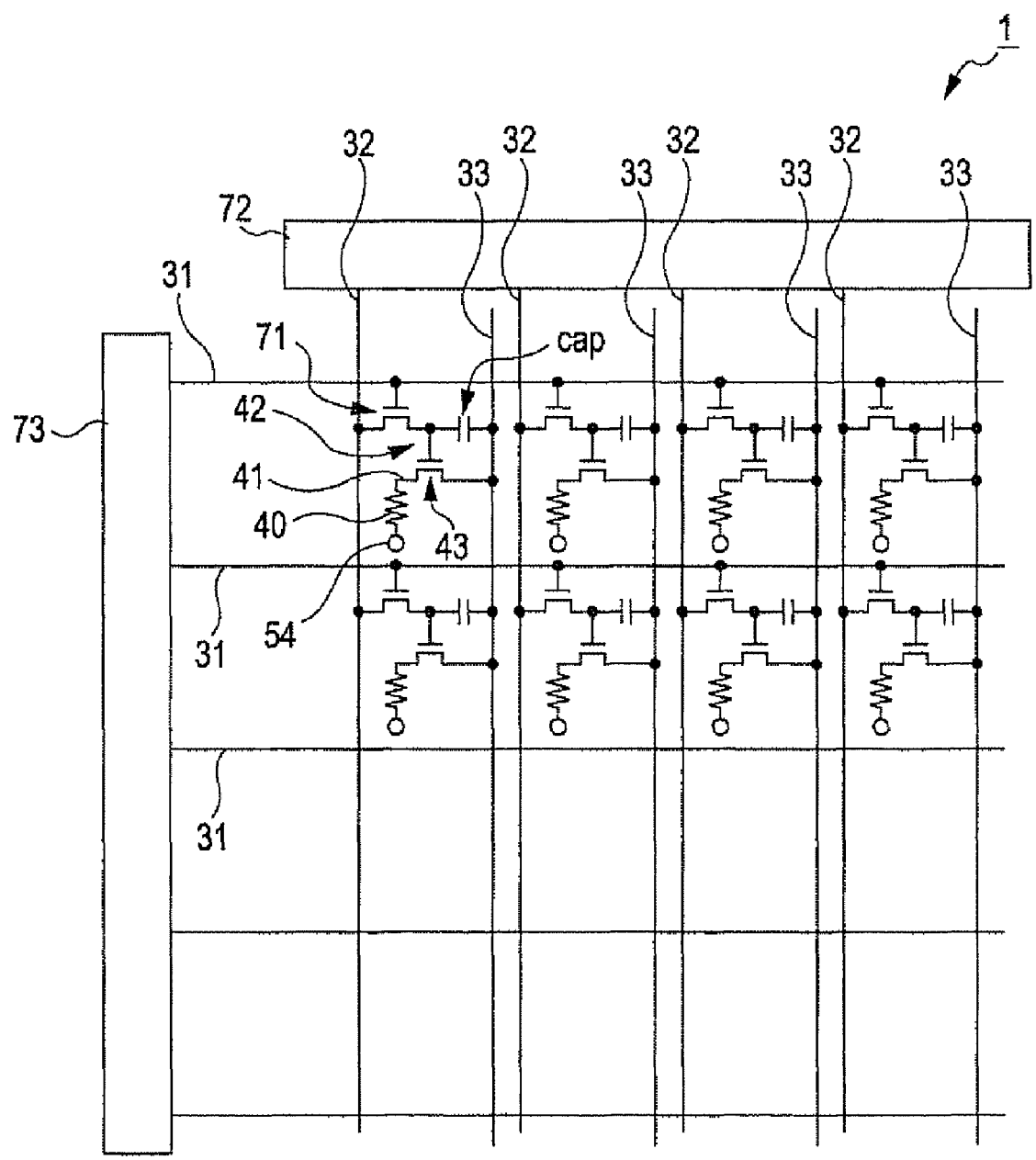
FIG. 1 is a circuit diagram of an organic EL device according to a first embodiment of the present invention.
Figure 2:
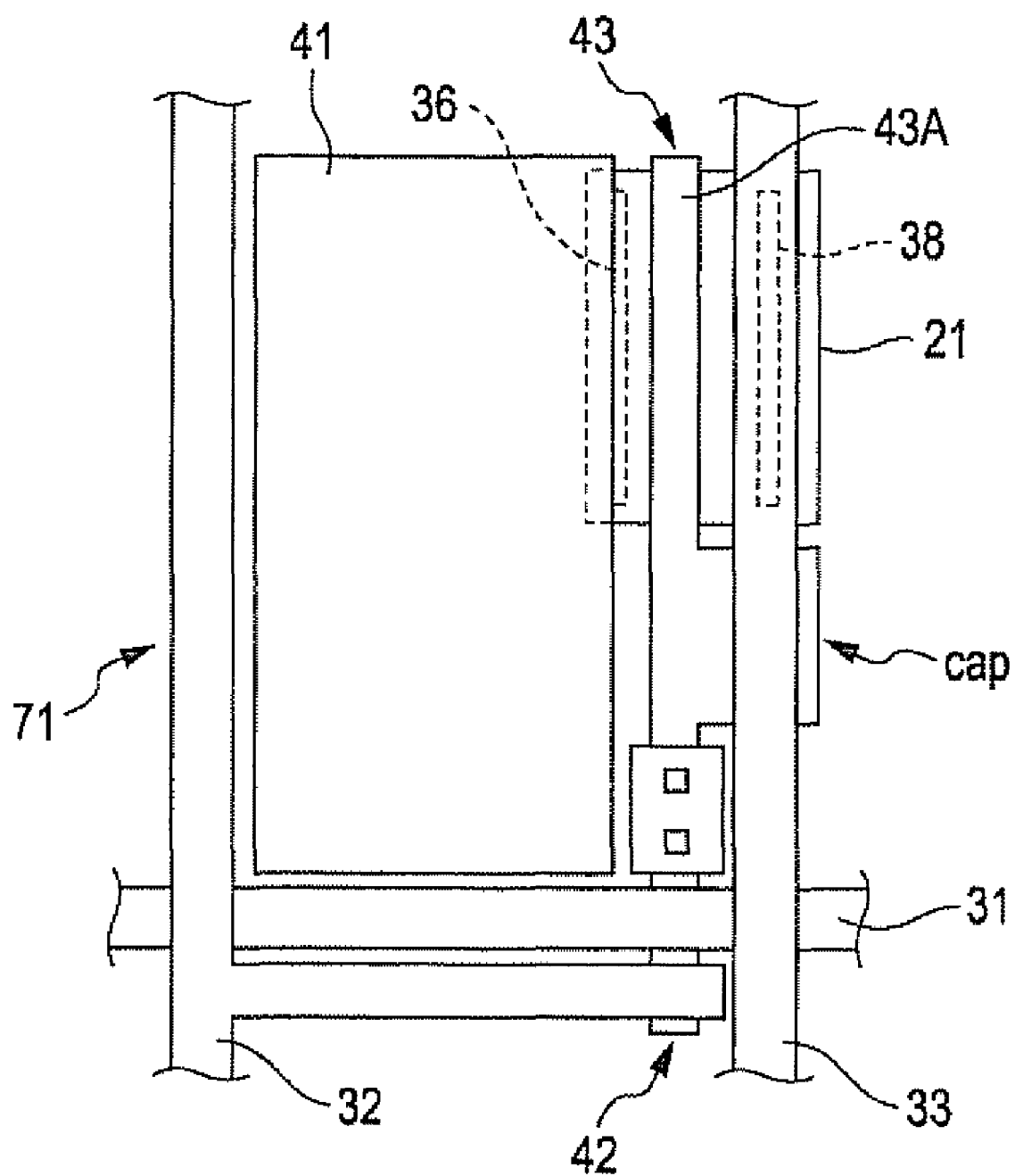
FIG. 2 is a plan view of a pixel region of the organic EL device according to the first embodiment of the invention.

FIG. 1 is a circuit diagram of the organic EL device according to the first embodiment. FIG. 2 is a plan view of a pixel region (when viewing the substrate from above) of the organic EL device, not showing the cathode or the organic luminescent layer.

Figure 3:
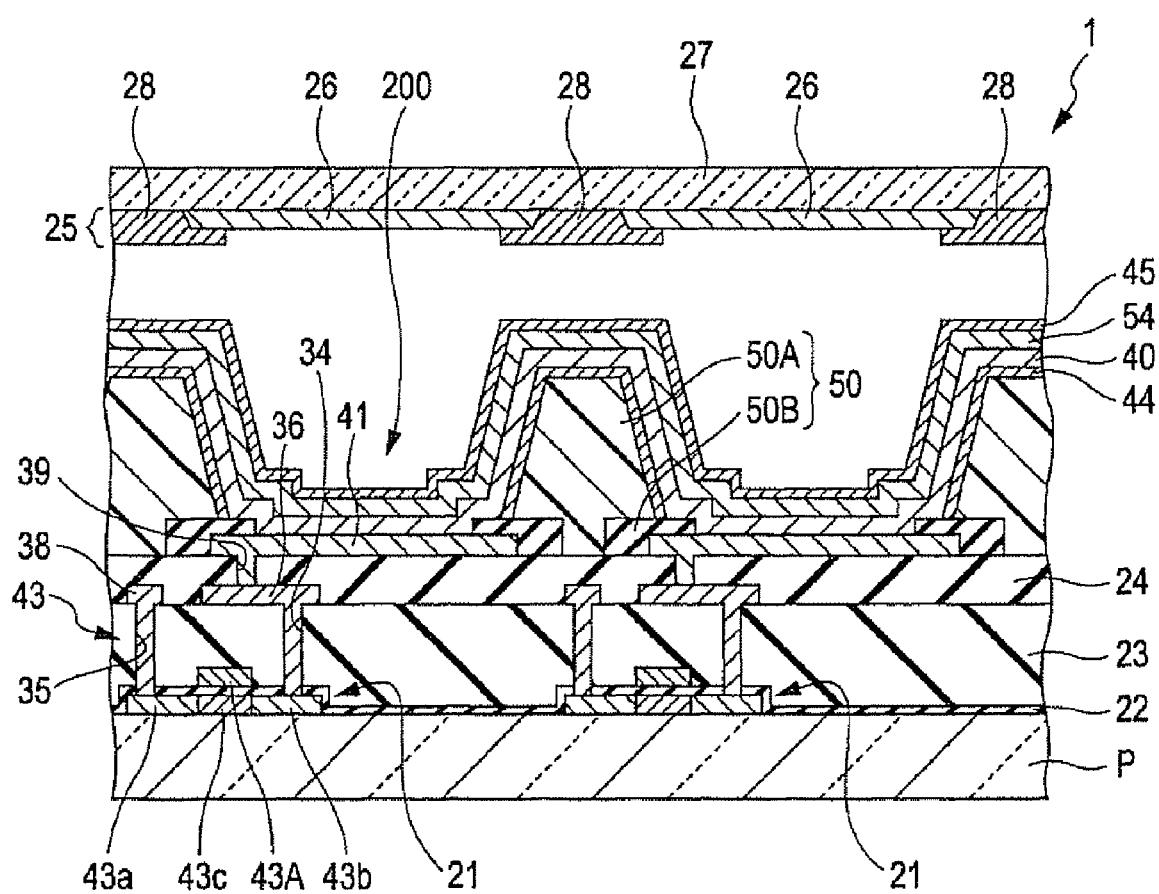
FIG. 3 is a schematic sectional view of the organic EL device according to the first embodiment of the invention.

FIG. 3 is an enlarged schematic sectional view of the organic EL device.

As shown in FIG. 1, the organic EL device 1 has a plurality of scanning lines 31, a plurality of signal lines 32 extending in a direction intersecting the scanning lines 31, and a plurality of common power-supply lines 33 extending along the signal lines 32. Pixel regions are provided at the respective intersections of the scanning lines 31 and the signal lines 32.

The signal lines 32 are connected to a data driving circuit 72 including a shift resistor, a level shifter, a video line, and an analog switch. The scanning lines 31 are connected to a scanning driving circuit 73 including a shift resistor and a level shifter.

Each pixel region has a switching TFT (thin film transistor) 42, a hold capacitor cap, a driving TFT 43, a pixel electrode (anode) 41, a cathode 54, and an organic luminescent layer 40. A scanning signal (power) is applied to the gate electrode of the switching TFT 42 through the scanning line 31. The hold capacitor cap holds an image signal transmitted from the signal line 32 through the switching TFT 42. The image signal held by the hold capacitor cap is transmitted to the gate electrode of the driving TFT 43. When the pixel electrode 41 is electrically connected to the common power-supply line 33 through the driving TFT 43, a driving current flows from the common power-supply line 33 to the pixel electrode 41. An organic luminescent layer 40 is disposed between the pixel electrode 41 and the cathode 54. The pixel electrode 41, the cathode 54, and the organic luminescent layer 40 define a light-emitting element.

When, in this structure, the switching TFT 42 is turned on by the operation of the scanning line 31, the potential (power) of the signal line 32 at that time is held by the hold capacitor cap, and whether the driving TFT 43 is on or off depends on the state of the hold capacitor cap. Then, a current (power) flows from the common power-supply line 33 to the pixel electrode 41 through the channel of the driving TFT 43, and further to the cathode 54 through the organic luminescent layer 40. Thus, the organic luminescent layer 40 emits light according to the current flowing in the organic luminescent layer 40.

Turning now to FIG. 2 showing a plan view of the pixel region 71, each pixel electrode 41 arranged in such a manner that the four sides of the substantially rectangular pixel electrode 41 are surrounded by the signal line 32, the common power-supply line 33, the scanning line 31, and another scanning line for another pixel electrode. The pixel electrode 41 is electrically connected to the driving TFT 43 by conductive connection to the drain electrode 36.

Sectional Structure

Turning now to FIG. 3 showing a sectional view of the pixel region 71, the driving TFT 43 is disposed on the substrate P, and a light-emitting element 200 is disposed on a first and a second insulating interlayer 23 and 24 covering the driving TFT 43.

The light-emitting element 200 includes the pixel electrode 41 in contact with the inside of a bank structure (partition structure) 50 formed on the substrate P, the organic luminescent layer 40 disposed on the pixel electrode 41, and the cathode 54 covering the organic luminescent layer 40.

The bank structure 50 is formed on the substrate P so as to partition (surround) each pixel region 71.

Since a top-emission organic EL device as in the first embodiment emits light from the side on which the organic EL light-emitting elements 200 are arranged, the substrate P may be made of a transparent material, such as glass, or an opacity material.

Opacity substrates include alumina or other ceramic substrates, stainless steel or other metal sheets whose surface is oxidized for insulation, and thermosetting or thermoplastic resins and films (plastic film).

The driving TFT 43 formed on the substrate P includes a source region 43a, a drain region 43b and a channel region 43c formed in the semiconductor layer 21, and a gate electrode 43A formed on the semiconductor layer 21 and opposing the channel region 43c with the gate insulating layer 22 in between.

The first insulating interlayer 23 covers the semiconductor layer 21 and the gate insulating layer 22. The first insulating interlayer 23 has contact holes 34 and 35 reaching the semiconductor layer 21, and a drain electrode 36 and a source electrode 38 are formed in the contact holes 34 and 35 respectively. The drain electrode 36 and the source electrode 38 are electrically connected to the drain region 43b and the source region 43a, respectively.

The second insulating interlayer 24 is formed on the first insulating interlayer 23 and has a contact hole 39. Part of the pixel electrode 41 is buried in the contact hole 39.

The driving TFT 43 and the pixel electrode 41 (light-emitting element 200) are electrically connected to each other by conductive connection between the pixel electrode 41 and the drain electrode 36.

The first insulating interlayer 23 and the second insulating interlayer 24 double as a planarizing layer planarizing the unevenness of the substrate P produced by formation of the driving TFT 43, the drain electrode 36, and the source electrode 38.

The bank structure 50 includes a stack of an inorganic bank (in organic partition) 50B and an organic bank (organic partition) 50A.

The inorganic bank 50B is made of an insulating inorganic material, such as $SiO_2$ or SiN.

The organic bank 50A is made of an organic material, such as acrylic resin or polyimide, as with the first insulating interlayer 23 and the second insulating interlayer 24.

More specifically, the inorganic bank 50B is formed on the second insulating interlayer 24 so as to cover the side surfaces and upper edge of the pixel electrode 41. The inorganic bank 50B exposes part of the pixel electrode 41 (upper surface) and is thus formed corresponding to each pixel region 71. The inorganic bank 50B insulates between adjacent pixel electrodes 41. The inorganic bank SOB also exposes part of the second insulating interlayer 24.

The organic bank 50A covers the second insulating interlayer 24 exposed in the inorganic bank 50B and part of the inorganic bank 50B.

The organic bank 50A preferably has a thickness of about 2 to 3 μm.

An inorganic protective layer 44 formed of an inorganic material, such as SiN, to cover the surface of the organic bank 50A. The inorganic protective layer 44 preferably has a thickness of about 50 to 200 nm.

The inorganic protective layer 44 may be made of a material mainly containing SiO, $SiO_2$, SiON, SiN, AlO, AlN, or $Al_2O_3$ without limiting to SiN.

The organic luminescent layer 40 and the cathode 54 are formed on the pixel electrode 41 in contact with the bottom of the bank structure 50, thus forming the light-emitting element 200.

In the first embodiment, the organic luminescent layer 40 and the cathode 54 are formed over the entire surface of the substrate P, thus covering the upper surface of the bank structure 50 (organic bank 50A).

The organic luminescent layer 40 is formed by vacuum vapor deposition (gas phase process), as will be described below.

In the first embodiment, the organic luminescent layer 40 is made of a known low-molecular-weight material capable of emitting white fluorescence or phosphorescence. For example, a white element including two luminescent layers for blue and orange luminescence or a white element including three luminescent layers for red, green, and blue luminescence may be used.

The organic luminescent layer 40 further includes, but not shown in the figures, a hole injection/transport layer and an electron injection/transport layer, in addition to the luminescent layer.

The hole injection/transport layer, the luminescent layer, and the electron injection/transport layer are each formed of a suitable vapor deposition material by a known vapor deposition.

The organic EL device 1 of the first embodiment is a so-called top emission organic EL device emitting light through a sealing substrate 27.

Therefore the cathode 54 is made of a transparent material. The transparent material for the cathode 54 may be indium tin oxide (ITO), an aluminum thin film, or a magnesium silver thin film. For example, the first embodiment uses ITO.

The pixel electrode 41 can be made of an appropriate electroconductive material, such as a metal, and is made of ITO in the first embodiment. The organic EL device 1 of the first embodiment, which is a top emission organic EL device, has a reflection layer (not shown) made of, for example, aluminum under the pixel electrode 41 to efficiently emit light outward.

In addition, a cathode protection layer 45 is formed over the cathode 54.

The cathode protection layer 45 can prevent the corrosion of the cathode 54 in the manufacturing process.

The cathode protection layer 45 can prevent the oxidation of the cathode 54 effectively.

The cathode protection layer 45 may be made of an inorganic compound, for example, a silicon compound, such as silicon oxide, silicon nitride, or silicon nitride oxide.

In the organic EL device 1 of the first embodiment, the organic luminescent layer 40, the cathode 54, and the cathode protection layer 45 spread over the surface, from the upper surface to the sides, of the bank structure 50.

The organic bank 50A has inclined surfaces forming a tapered shape in sectional view.

This shape allows the organic luminescent layer 40 to be formed by vapor deposition so as to come into appropriate contact with the surface of the organic bank 50A. Thus, high adhesion can be achieved between the organic luminescent layer 40 and the organic bank 50A.

The cathode 54 is also formed over the organic luminescent layer 40 along the tapered surfaces, thus preventing disconnection.

In the organic EL device 1 of the first embodiment, a color filter substrate 25 is disposed so as to oppose the substrate P.

The color filter substrate 25 includes color filters 26 for three primary colors (R, G, and B) and a light-shielding black matrix (BM) pattern 28. The color filter substrate 25 is disposed in such a manner that the pixel regions 71 on the substrate P oppose the color filters 26. Further, a sealing substrate 27 is disposed on the color filter substrate 25.

The sealing substrate 27 is made of a transparent material, such as glass. The sealing substrate 27 may have a recess in the internal surface (between the sealing substrate 27 and the substrate P) and a getter absorbing water or oxygen (for example, CaO to BaO) may be placed in the recess. The getter can absorb water or oxygen permeating into the organic EL device 1.

A method for manufacturing the organic EL device 1 will now be described. It will be explained throughout the description of the manufacturing method why the organic EL device 1 can exhibit superior light-emitting characteristics over a long time.

Manufacturing Method of Organic EL Device

The manufacturing method of the organic EL device 1 will now be described with reference to FIGS. 4A to 4D and 5A to 5C.

The driving TFT 43 and the pixel electrode 41 are formed by known steps, and the following description will illustrate the subsequent steps in detail.

Figure 4A:
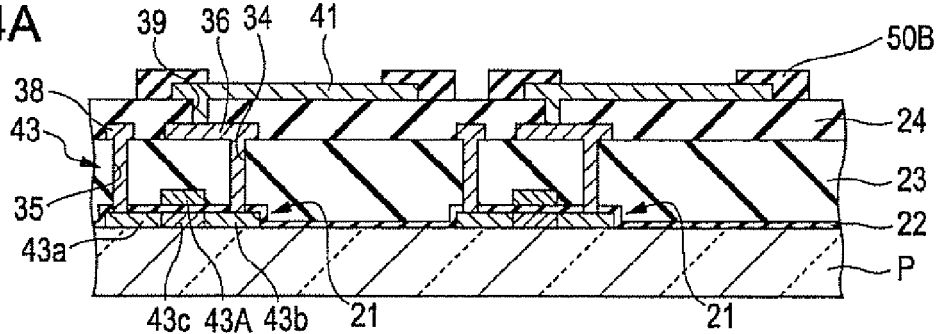
FIGS. 4A to 4D are representations of a manufacturing process of the organic EL device according to the first embodiment of the invention.

As shown in FIG. 4A, first, driving TFTs 43, a first insulating interlayer 23, and a second insulating interlayer 24 are formed in that order on a substrate P made of, for example, glass. Then, the pixel electrodes 41 are formed. Each pixel electrode 41 is electrically connected to the corresponding driving TFT 43 through a contact hole 39 formed in the second insulating interlayer 24. Subsequently, inorganic banks 50B are formed on the second insulating interlayer 24.

More specifically, an inorganic layer of $SiO_2$, $TiO_2$, SiN or the like is formed over the entire surfaces of the second insulating interlayer 24 and the pixel electrodes 41 by CVD, sputtering, vapor deposition, or the like. In the first embodiment, the inorganic layer is made of $SiO_2$. Subsequently, the inorganic layer is patterned into inorganic banks 50B by photolithography.

Each inorganic bank 50B is provided only on the second insulating interlayer 24 and around the periphery (on the upper edge and side surfaces) of the pixel electrode 41, thus exposing the middle area of the surface of the pixel electrode 41.

Figure 4B:
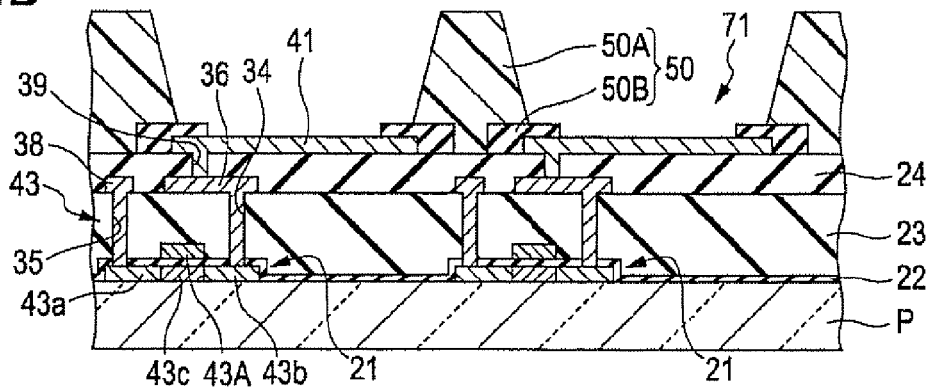

Tuning now to FIG. 4B, the organic banks 50A are formed on the respective inorganic banks 50B.

The organic bank 50A can be made of an organic resin, such as acrylic resin or polyimide resin.

A liquid material prepared by dissolving, for example, an acrylic resin or polyimide in a solvent is applied by, for example, spin coating or dip coating to form an organic bank layer.

The organic bank layer is then patterned to form openings by photolithography, thus forming the organic banks 50A.

The openings for forming the organic banks 50A are slightly larger than the openings for forming the inorganic banks 50B, as shown in FIG. 3.

By forming the organic banks 50A on the inorganic banks 50B, a bank structure 50 is formed on the substrate P. The bank structure partitions the pixel regions 71.

Forming Inorganic Protective Layer

Figure 4C:
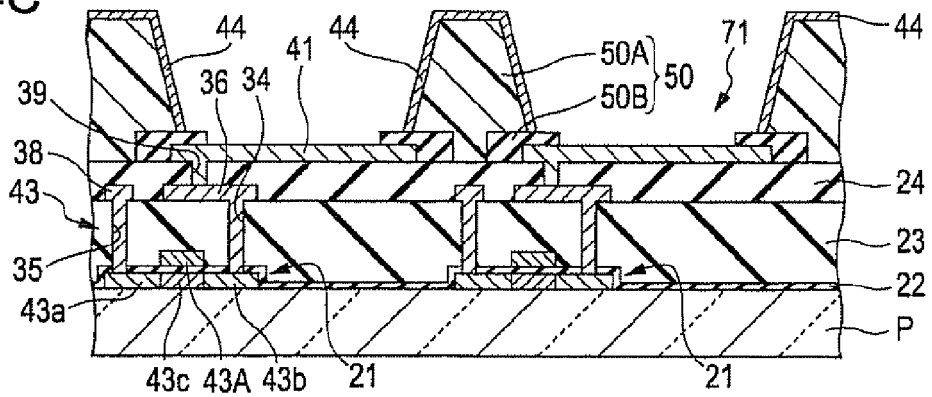

Turning now to FIG. 4C, an inorganic protective layer 44 is formed to cover the surfaces of the organic banks 50A.

Specifically, a SiN inorganic layer is selectively formed by CVD, sputtering, vapor deposition, or the like through a mask having holes corresponding to the regions in which the organic banks 50A are disposed. Thus, the inorganic protective layer 44 is formed.

The inorganic protective layer 44 may be formed of other inorganic material, such as Sio, $SiO_2$, SiON, SiN, AlO, AlN, or $Al_2O_3$.

The thickness of the inorganic protective layer 44 is preferably set in the range of 50 to 200 nm (50 nm in the first embodiment).

This is because an inorganic protective layer 44 having a thickness of less than 50 nm does not have sufficient resistance to plasma treatment described below.

In contrast, an inorganic protective layer 44 having a thickness of 200 nm or more may be cracked and result in insufficient resistance to the plasma treatment.

Figure 4D:
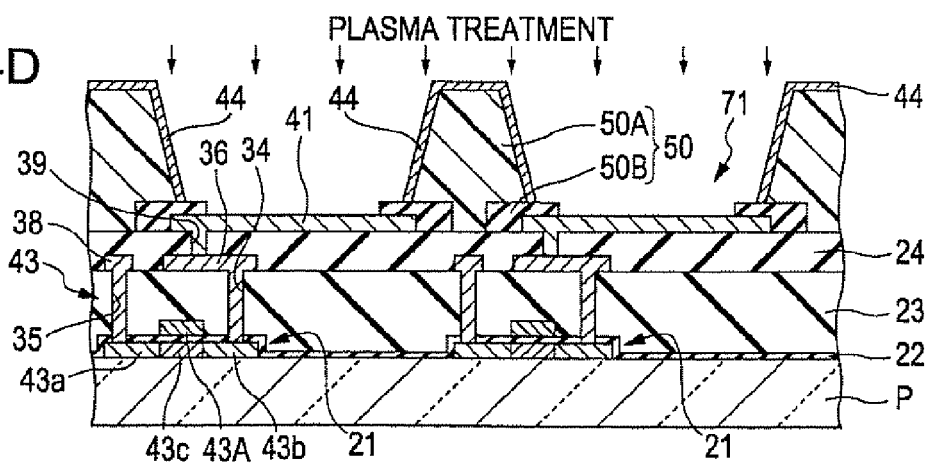

Subsequently, plasma treatment is performed, as shown in FIG. 4D.

The plasma treatment activates the surface acting as the electrode of the pixel electrode 41, and is mainly intended to clean the surface acting as the electrode of the pixel electrode 41.

If the surface of the pixel electrode 41 is not cleaned sufficiently, the organic luminescent layer 40 cannot be evenly formed on the pixel electrode 41 and may cause inconsistencies in light emission. Thus, display quality of the resulting organic EL device may be degraded.

Accordingly, the intensity of the plasma is desirably increased as much as possible for the plasma treatment.

On the other hand, since the acrylic resin organic bank 50A is less resistant to plasma, part of the organic bank 50A may be broken (etched) by the plasma treatment.

In the organic EL device 1 of the first embodiment, however, the organic banks 50A is covered with the inorganic protective layer 44.

The inorganic protective layer 44 is highly resistant to the plasma treatment.

Hence, the inorganic protective layer 44 is not broken (etched) by the plasma treatment.

Thus, the organic bank 50A underlying the inorganic protective layer 44 is not damaged and the surface of the pixel electrode 41 can be appropriately cleaned.

Forming Organic Luminescent Layer

Figure 5A:
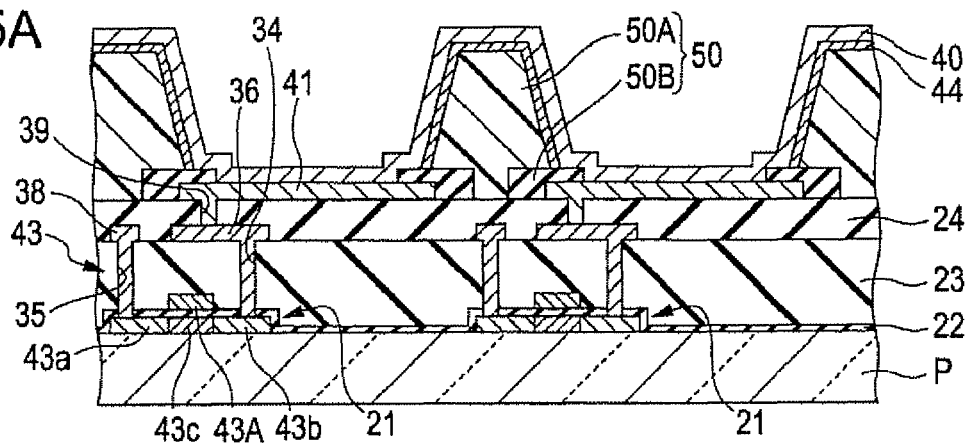
FIGS. 5A to 5C are representations of the manufacturing process of the organic EL device according to the first embodiment of the invention.

Turning now to FIG. 5A, an organic luminescent layer 40 is formed over the entire surfaces of the pixel electrodes 41 and the bank structure 50 by, for example, vacuum vapor deposition.

Since the surface of the pixel electrode 41 has been sufficiently cleaned by the plasma treatment, a highly uniform organic luminescent layer 40 can be formed on the pixel electrode 41.

The organic bank 50A of the bank structure 50 has inclined surfaces forming a tapered shape in sectional view, as shown in FIG. 2.

This shape allows the material of the organic luminescent layer 40 to be appropriately deposited along the inclined surfaces of the organic bank 50A.

In the first embodiment, a hole injection/transport layer, a luminescent layer, and an electron injection/transport layer are deposited to form the organic luminescent layer 40.

The hole injection/transport layer, the luminescent layer, and the electron injection/transport layer are formed by known vapor deposition method using deposition materials suitable for the respective layers.

Vapor deposition materials for the luminescent layer include low-molecular-weight materials, such as anthracene, pyrene, 8-hydroxyquinoline aluminum, bis(styryl)anthracene derivatives, tetraphenyl butadiene derivatives, coumarin derivatives, oxadiazole derivatives, distyrylbenzene derivatives, pyrrolopyridine derivatives, perinone derivatives, cyclopentadiene derivatives, and thiadiazolopyridine derivatives. These low-molecular-weight materials may be doped with rubrene, a quinacridone derivative, a phenoxazone derivative, DCM, DCJ, perinone, a perylene derivative, a coumarin derivative, or a diazaindacene derivative.

Vapor deposition materials for the hole injection/transport layer include starburst amine, oligoamine, and triphenylamine polymers.

Vapor deposition materials for the electron injection/transport layer include metal complexes of oxadiazole derivatives, oxazole derivatives, phenanthroline derivatives, anthraquinodimethane derivatives, benzoquinone derivatives, naphthoquinone derivatives, anthraquinone derivatives, tetracyanoanthraquinodimethane derivatives, fluorenone derivatives, diphenyldicyanoethylene derivatives, diphenyldicyanoethylene derivatives, diphenoquinone derivatives, and hydroxyquinoline derivatives.

Figure 5B:
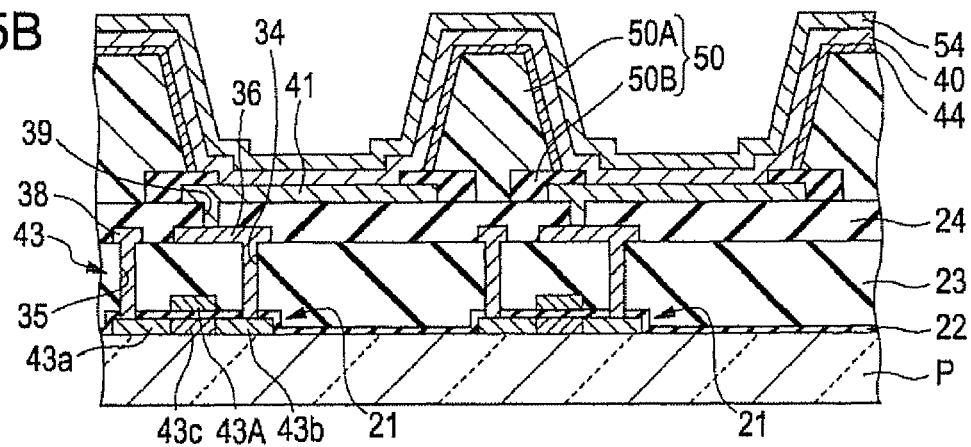

Turning to FIG. 5B, a cathode 54 is formed over the entire surface of the substrate to cover the organic luminescent layer 40.

In order to produce a top emission structure, the cathode 54 is formed of transparent ITO by physical vapor deposition, such as ion plating.

Alternatively, the cathode 54 may be formed of an aluminum thin film or a magnesium silver thin film by vapor deposition.

Since the organic luminescent layer 40 has been evenly formed with a uniform thickness along the surfaces of the organic bank 50A, the cathode 54 can also be formed with uniform thickness over the organic luminescent layer 40.

Figure 5C:
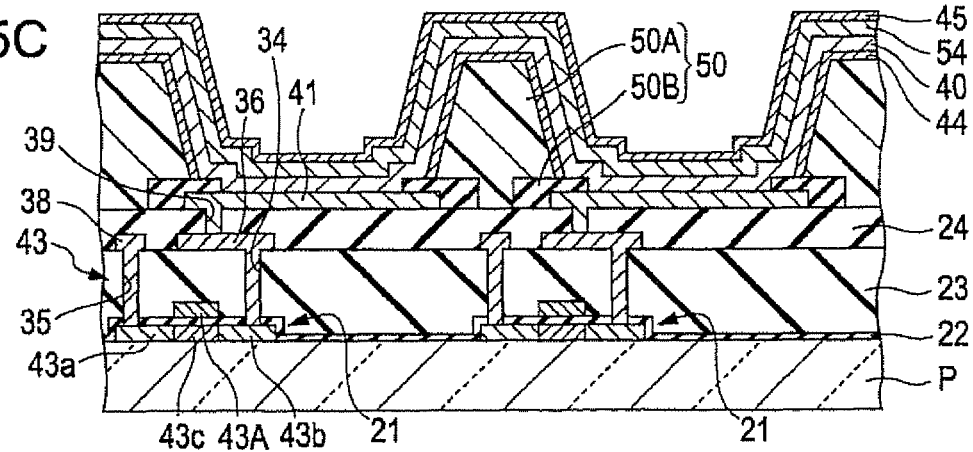

In addition, in order to prevent oxygen or moisture from degrading the organic EL element, the cathode protection layer 45 is formed of an inorganic material, for example, a silicon compound such as silicon oxide, silicon nitride, or silicon nitride oxide, on the cathode 54, as shown in FIG. 5C.

The formation of the cathode protection layer 45 can be performed by, for example, CVD, sputtering, or vapor deposition.

Then, a color filter substrate 25 is stacked on the substrate P. The substrate P and the color filter substrate 25 are bonded together and sealed by the sealing substrate 27 with a sealing resin. Thus, the organic EL device 1 is completed.

In the structure of the organic EL device 1 of the first embodiment, as described above, the inorganic protective layer 44 covering the surfaces of the organic bank 50A prevents the organic bank 50A from being damaged even though the surface of the pixel electrode 41 is cleaned by plasma treatment for forming the organic luminescent layer 40.

Consequently, the surface of the pixel electrode 41 is not contaminated.

Therefore, the organic luminescent layer 40 can be favorably formed on the pixel electrode 41 and the resulting organic EL device can exhibit superior light-emitting characteristics over a long time.

Second Embodiment

An organic EL device according to a second embodiment will now be described with reference to the drawings.

The same parts of the organic EL device of the second embodiment as those of the first embodiment are designated by the same reference numerals and the description is not repeated.

The inorganic protective layer of the organic EL device of the second embodiment has a different structure from the inorganic protective layer 44 in the first embodiment.

Sectional Structure

Figure 6:
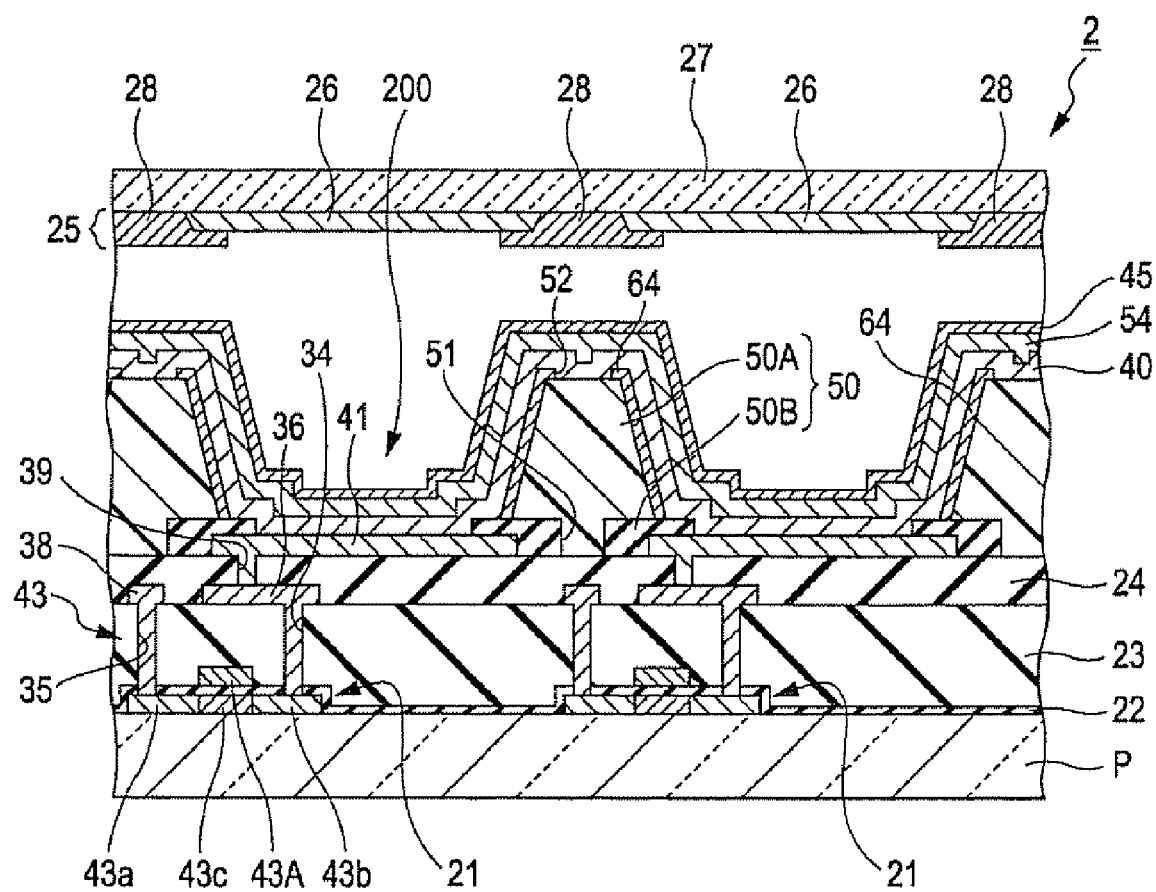
FIG. 6 is a schematic sectional view of an organic EL device according to a second embodiment of the invention.

As shown in FIG. 6, the inorganic bank 50B has a first aperture 51 on the second insulating interlayer 24 in the region not having the pixel electrode 41. The second insulating interlayer 24 is exposed in the first aperture 51.

Part of the organic bank 50A formed on the second insulating interlayer 24 is buried in the first aperture 51.

Thus, the organic bank 50A is in contact with the second insulating interlayer 24 through the first aperture 51.

The organic bank 50A preferably has a thickness of about 2 to 3 μm as in the first embodiment.

An inorganic protective layer 64 is formed of an inorganic material, such as SiN, to cover the surface of the organic bank 50A. The inorganic protective layer 64 is formed of the same material to the same thickness as the inorganic protective layer 44 in the first embodiment.

The inorganic protective layer 64 has a second aperture 52 to expose the organic bank 50A.

More specifically, the second aperture 52 is formed in the region of the inorganic protective layer 64 corresponding to the upper surface of the organic bank 50A.

Figure 7:
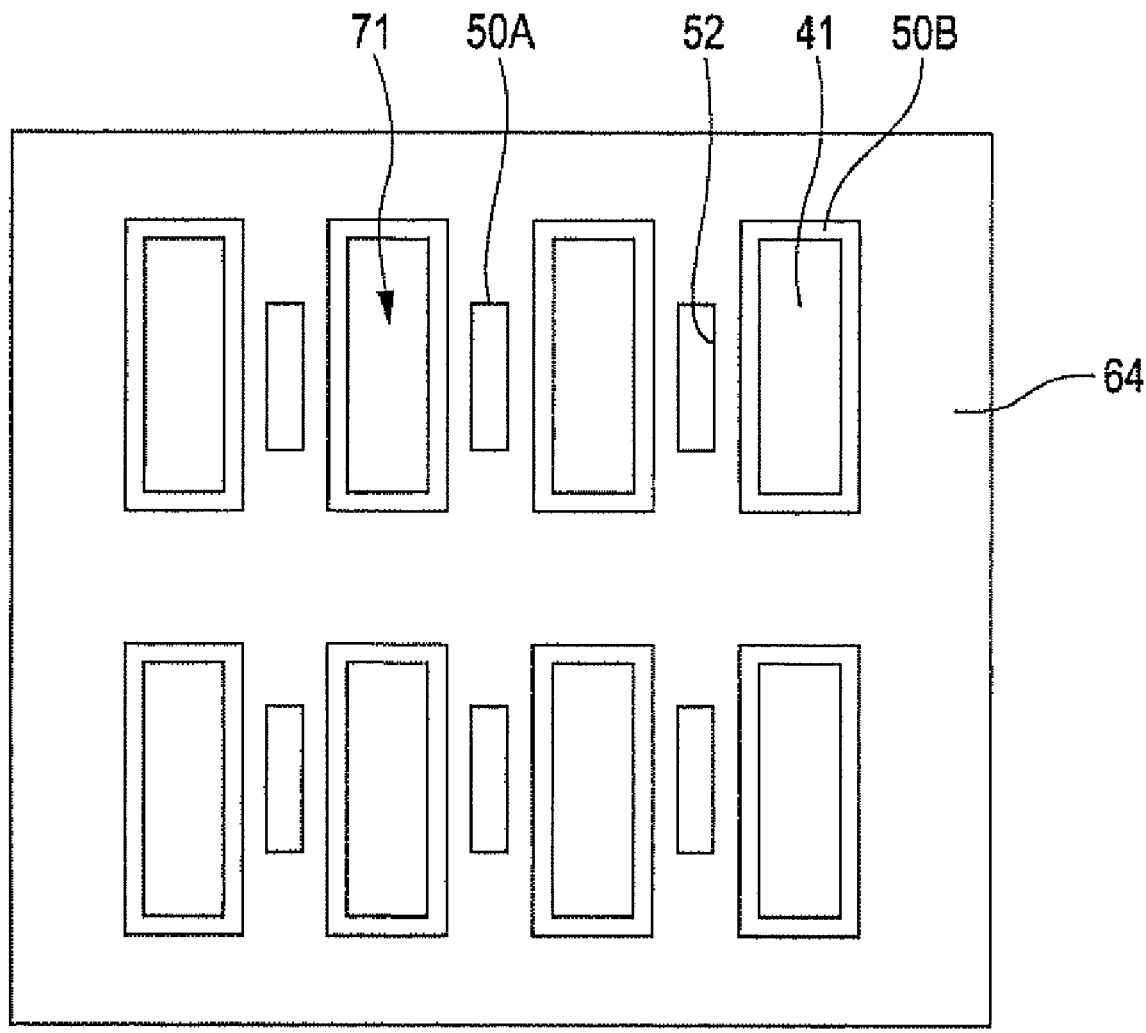
FIG. 7 is a plan view illustrating second openings formed in an inorganic protective layer of the organic EL device according to the second embodiment of the invention.

FIG. 7 is a plan view of the second openings 52 formed in the inorganic protective layer 64 when viewing the substrate P from above.

As shown in FIG. 7, the second openings 52 each have a rectangular shape, and in which the upper surface of the organic bank 50A separating the lengthwise sides of the adjacent pixel regions 71 is exposed.

Preferably, the second aperture 52 is formed so as to cover at least part of the first aperture 51 when viewing the substrate P from above (see FIG. 6).

For example, the region of the second aperture 52 may cover the region of the first aperture 51 when viewed from above, that is, the second aperture 52 has a larger area than the first aperture 51.

In the known organic EL device, the organic bank or the planarizing layer outgases during the operation of the organic luminescent layer. The luminescent layer may be negatively affected by the gas to cause emission failure because the inorganic bank covers the planarizing layer.

On the other hand, in the organic EL device 2 of the second embodiment, the second insulating interlayer 24 and the organic bank 50A outgas during the formation of the organic luminescent layer 40.

The gas generated from the second insulating interlayer 24 enters the organic bank 50A through the first aperture 51, and is then released to the outside through the second aperture 52 together with the gas generated in the organic bank 50A.

Thus, the organic EL device 2 of the second embodiment has a structure in which gas generated from the organic material during the manufacturing process can be released to the outside. Consequently, no gas is generated during the operation of the organic EL device. Thus, problems resulting from outgassing, such as emission failure, can be prevented.

Manufacturing Method of Organic EL Device

The manufacturing method of the organic EL device 2 will now be described with reference to FIGS. 8A to 8D and 9A to 9C.

The driving TFT 43 and the pixel electrode 41 are formed by known steps, and the following description will illustrate the subsequent steps in detail.

Figure 8A:
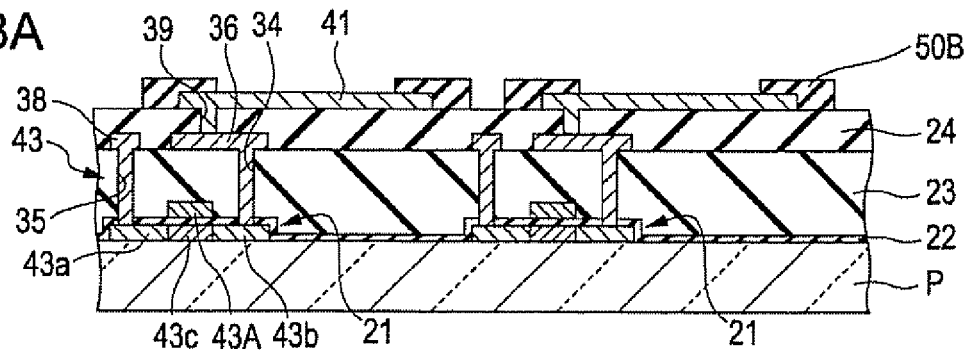
FIGS. 8A to 8D are representations of a manufacturing process of the organic EL device according to the second embodiment of the invention.

As shown in FIG. 8A, first, driving TFTs 43, a first insulating interlayer 23, a second insulating interlayer 24, contact holes 39, pixel electrodes 41, and inorganic banks 50B are formed in that order on the substrate P made of, for example, glass. The step shown in FIG. 8A is the same as the step shown in FIG. 4A in the first embodiment.

In this step, a first aperture 51 is formed in the inorganic bank 50B to expose the portion of the second insulating interlayer 24 not having the pixel electrode 41.

Figure 8B:
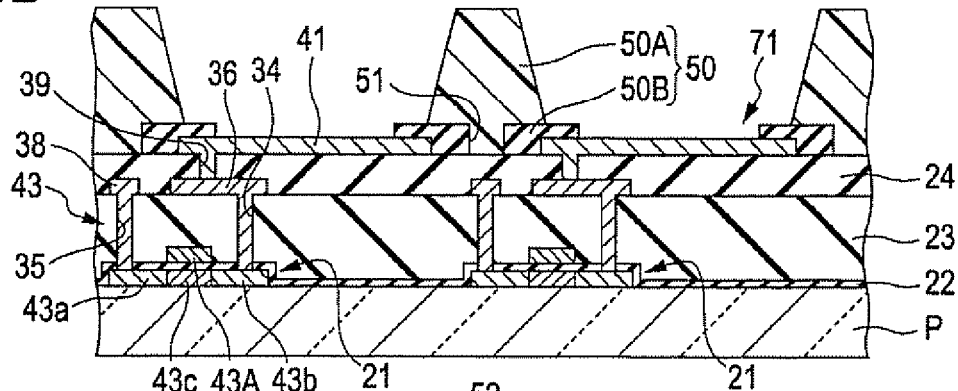
Figure 8C:
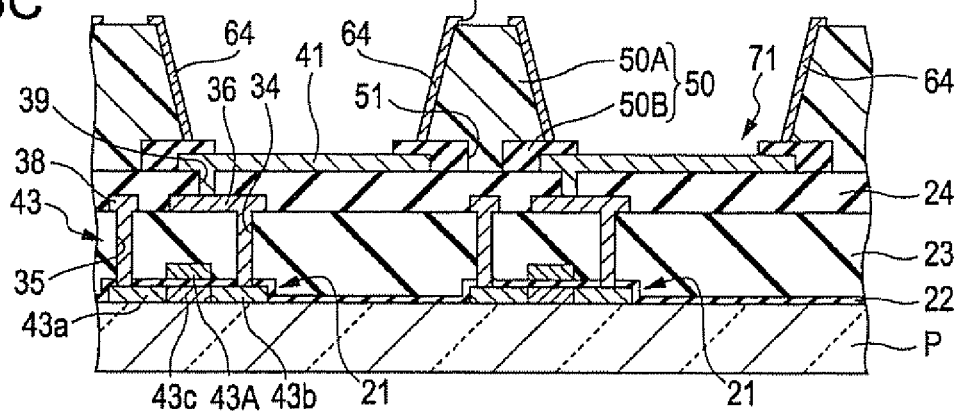

Turning now to FIG. 8B, organic banks 50A are formed on the respective inorganic banks 50B. The organic banks 50A are formed in the same manner as in the step shown in FIG. 4B in the first embodiment.

The inorganic bank 50B has the first aperture 51 in which the second insulating interlayer 24 is exposed as described above, and the organic material of the organic bank 50A is buried in the first aperture 51.

Thus, the organic bank 50A is in contact with the second insulating interlayer 24 through the first aperture 51.

Forming Inorganic Protective Layer

Turning now to FIG. 5C, an inorganic protective layer 64 is formed to cover the surfaces of the organic banks 50A.

Specifically, a SiN inorganic layer is selectively formed by CVD, sputtering, vapor deposition, or the like through a mask having holes corresponding to the regions in which the organic banks 50A and below described second apertures 52 are formed. Thus, the inorganic protective layer 64 is formed.

The inorganic protective layer 64 has second apertures 52 in the region corresponding to the upper surfaces of the organic banks 50A (see FIG. 6).

The material and the thickness of the inorganic protective layer 64 are the same as those of the inorganic protective layer 44 in the first embodiment.

In the second embodiment, the second aperture 52 preferably covers at least part of the first aperture 51 when viewing the substrate P from above.

Thus, in the second embodiment, the region of the second aperture 52 includes the region of the first aperture 51 when viewed from above (see FIG. 6).

Figure 8D:
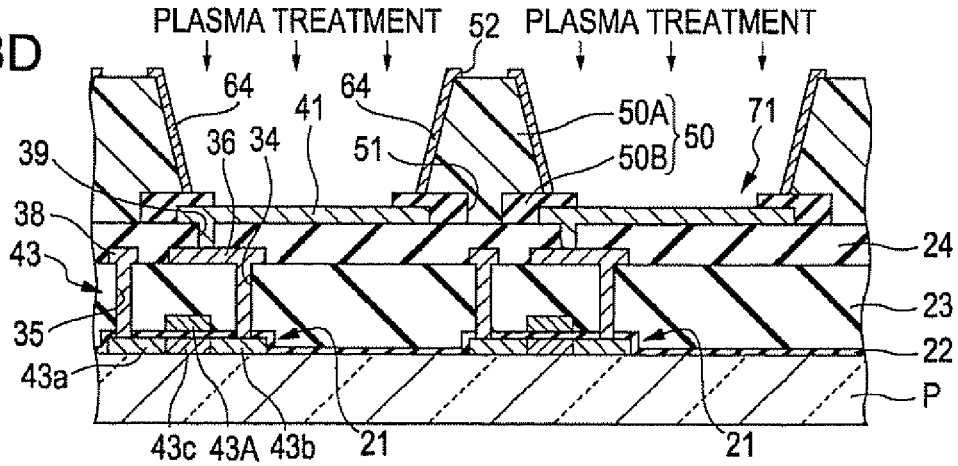

Subsequently, plasma treatment is performed, as shown in FIG. 8D.

Preferably, the plasma treatment is selectively performed on the surfaces of the pixel electrodes 41 exposed at the bottom of the openings (pixel regions 71) surrounded by the bank structure 50. In this instance, however, not only the surfaces of the pixel electrodes 41, but also the side surfaces of the organic banks 50A are partially exposed to the plasma.

The organic bank 50A, which is made of an acrylic resin as described above, is not sufficiently resistant to plasma.

Accordingly, the organic bank 50A is partially broken (etched) by the plasma treatment, and foreign matter is deposited on the pixel electrodes 41 to contaminate the pixel electrodes.

On the other hand, in the organic EL device 2 of the second embodiment, the surface of the organic bank 50A is covered with the inorganic protective layer 64.

The inorganic protective layer 64 is highly resistant to plasma, and accordingly the organic bank 50A covered with the inorganic protective layer 64 is not broken (etched) by the plasma treatment.

Thus, the organic bank 50A underlying the inorganic protective layer 64 is not damaged and the surface of the pixel electrode 41 can be appropriately cleaned.

As described above, the inorganic protective layer 44 has the second aperture 52 in which the organic bank 50A is exposed. Therefore, the portion of the organic bank 50A exposed in the second aperture 52 may undergo the plasma treatment.

In the second embodiment, however, the second aperture 51 is formed on the upper surface of the organic bank, which is not affected much by the plasma treatment. Accordingly, the organic bank 50A exposed in the second aperture 51 is prevented from being etched.

Forming Organic Luminescent Layer

Figure 9A:
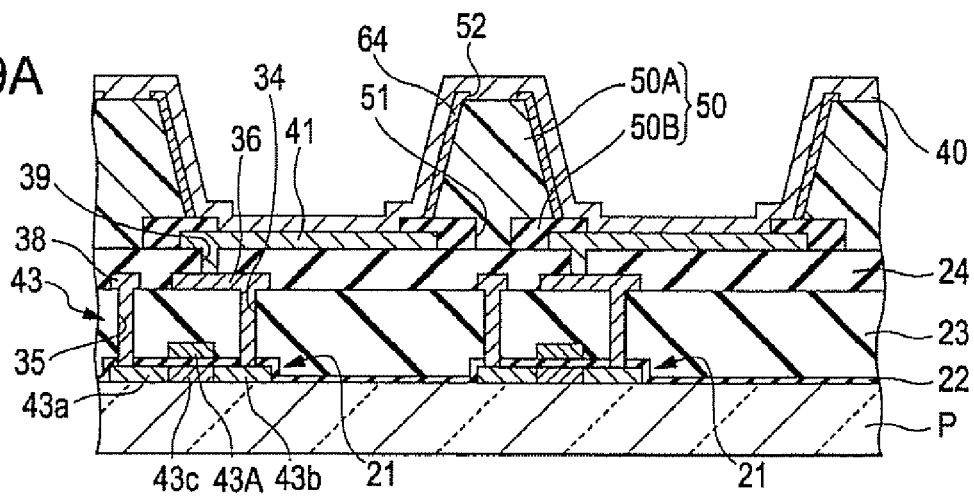
FIGS. 9A to 9C are representations of the manufacturing process of the organic EL device according to the second embodiment of the invention.

Turning now to FIG. 9A, an organic luminescent layer 40 is then formed over the entire surfaces of the pixel electrodes 41 and the bank structure 50. This step is performed in the same manner as the step shown in FIG. 5A in the first embodiment.

The second insulating interlayer 24 and organic bank 50A made of an organic material, such as acrylic resin or polyimider outgas in the step of vacuum vapor deposition for forming the organic luminescent layer 40.

The gas generated from the second insulating interlayer 24 enters the organic bank 50A through the first aperture 51.

The organic bank 50A also outgases.

If the inorganic protective layer 64 fully covers the surface of the organic bank 50A, the gas cannot be released, and the gas may break the inorganic protective layer 64. Consequently, the inorganic protective layer 64 may not exhibit high resistance to plasma.

In the organic EL device 2 of the second embodiment, accordingly, the second aperture 52 formed in the inorganic protective layer 64 allows the gas generated from the second insulating interlayer 24 and the organic bank 50A to be reliably released to the outside.

In addition, the second aperture 52 overlies the first aperture 51, as shown in FIG. 6, when viewing the substrate P from above. The gas passing through the first aperture 52 can be efficiently released to the outside through the second aperture 52 overlying the first aperture 51 when viewed from above.

Figure 9B:
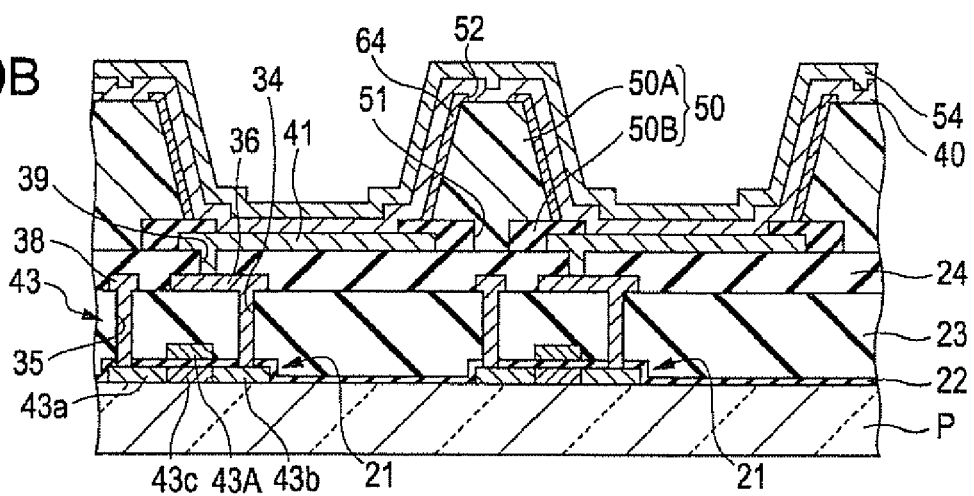

Turning now to FIG. 9B, a cathode 54 is then formed over the entire surface of the substrate P to cover the organic luminescent layer 40.

Figure 9C:
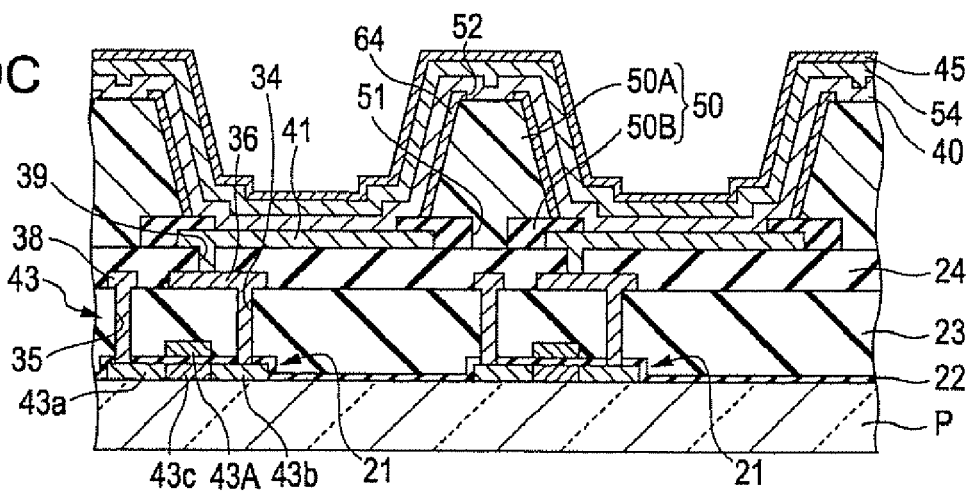

Furthermore, a cathode protection layer 45 is formed as shown in FIG. 9C.

In the second embodiment, the cathode 54 and the cathode protection layer 45 are formed in the same manner as in the first embodiment, as shown in FIGS. 5B and 5C.

Finally, a color filter substrate 25 is stacked on the substrate P. The substrate P and the color filter substrate 25 are bonded together and sealed by the sealing substrate 27 with a sealing resin. Thus, the organic EL device 2 shown in FIG. 6 is completed.

In the organic EL device 2 of the second embodiment, as described above, the surface of the organic bank 50A is covered with the inorganic protective layer 64. This structure can prevent the organic bank 50A from being damaged even though the surface of the pixel electrode 41 is cleaned by plasma treatment for forming the organic luminescent layer 40.

Thus, the contamination of the pixel electrode 41 can be prevented, which is caused by deposition on the pixel electrode 41 of foreign matter resulting from the plasma treatment that may partially etch the organic bank 50A.

Therefore, the organic luminescent layer 40 can be favorably formed on the pixel electrode 41 and the resulting organic EL device 2 can exhibit superior light-emitting characteristics over a long time.

In addition, gas generated from the second insulating interlayer 24 and the organic bank 50A during the formation of the organic luminescent layer can be released to the outside. Thus, problems resulting from outgassing during operation, such as emission failure, can be prevented. Consequently, the resulting organic EL device 2 is highly reliable.

The organic EL device 2 of the invention is not limited to the above-described exemplary embodiments, and various modifications may be made without departing from the scope and spirit of the invention.

Figure 10:
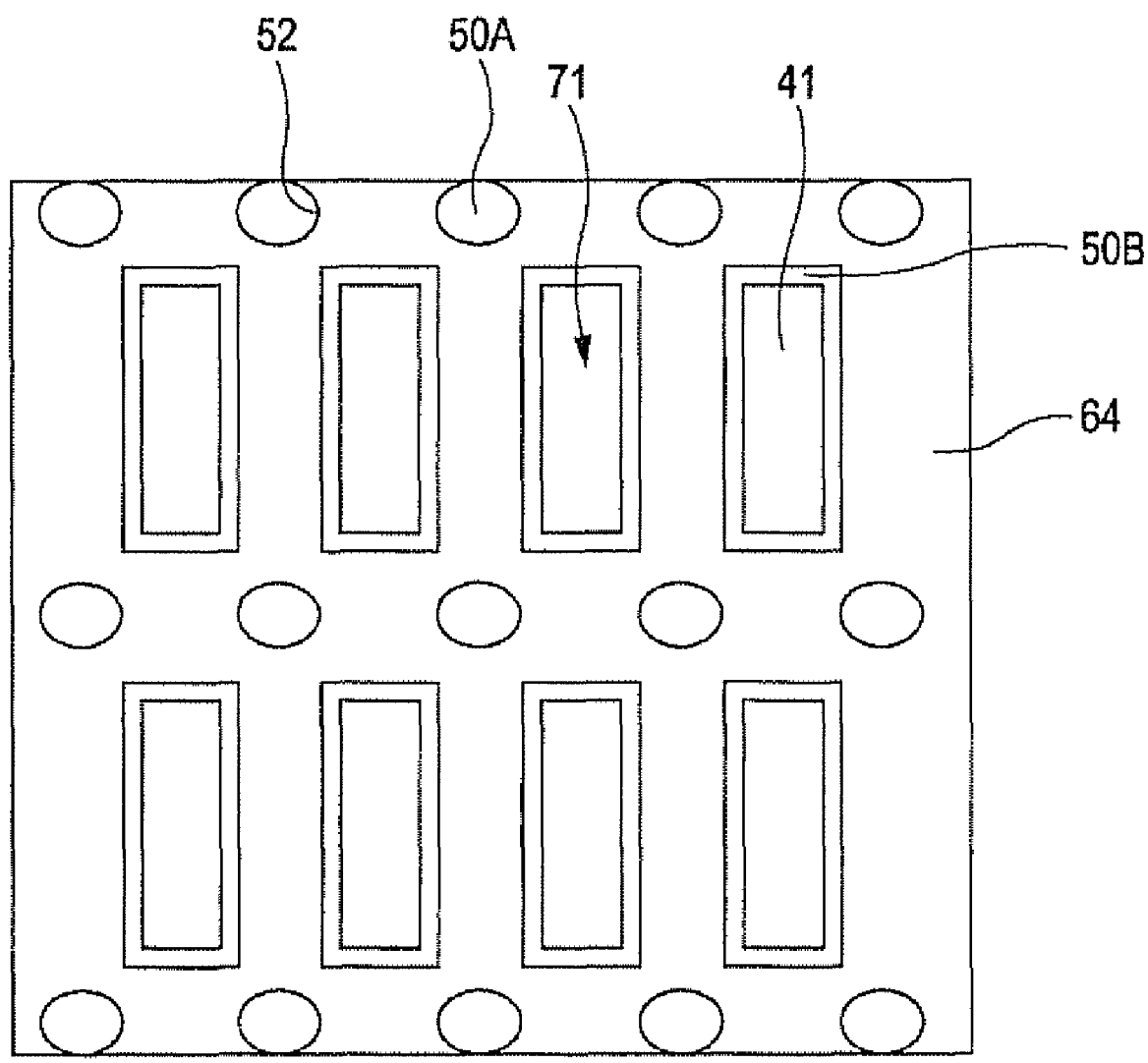
FIG. 10 is a plan view of second openings formed in the inorganic protective layer of the organic EL device according to a modification of the second embodiment of the invention.

For example, substantially elliptical second apertures 52 may be formed in the regions on the upper surface corresponding to the intersections of the organic banks 50A formed in a grid manner, as shown in FIG. 10.

In this structure, the pixel electrode 41 can be more distant from the second aperture 52 than in the structure shown in FIG. 7. Accordingly, the possibility of the damage to the organic bank 50A exposed in the second aperture 52 from plasma treatment can be reduced.

Electronic Apparatus

An electronic apparatus including the organic EL device will now be described as an application of an organic EL device according to an embodiment of the invention.

Figure 11:
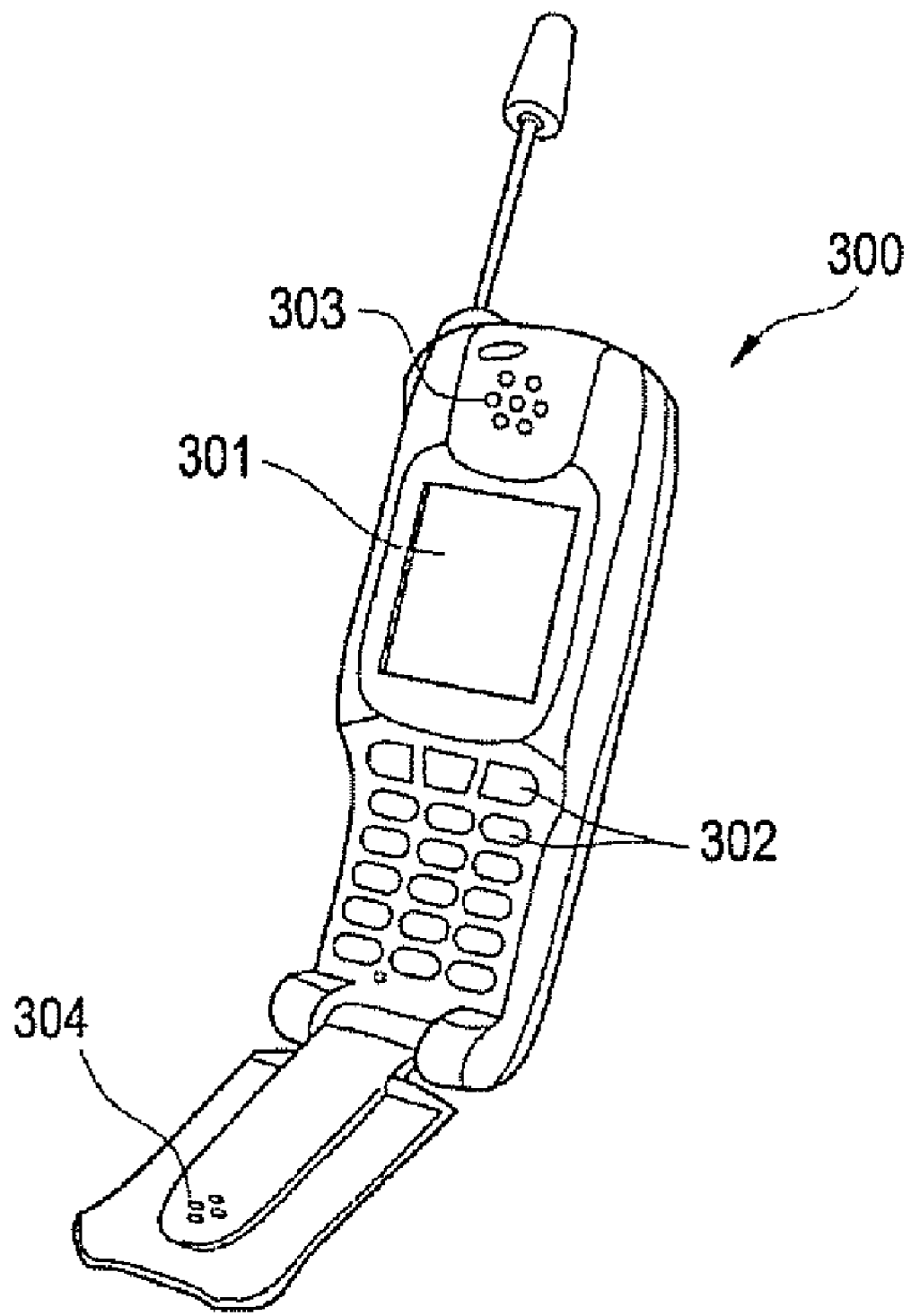
FIG. 11 is a schematic view of a cellular phone as an embodiment of an electronic apparatus.

FIG. 11 is a schematic view of a cellular phone including an organic EL device according to an embodiment of the invention as the display.

The cellular phone 300 shown in FIG. 11 includes the organic EL device as a small display 301, a plurality of control buttons 302, a ear piece 303, and a mouthpiece 304.

Since the display 301 of the cellular phone 300 is the organic EL device including pixel electrodes not contaminated by plasma treatment and preventing mission failure resulting from outgassing, consequently achieving highly reliable display over a long time, the cellular phone 300 can be of high quality.

The organic EL devices according to the above embodiments can be suitably used as an image displaying unit of various types of electronic apparatuses, such as electronic books, projectors, personal computers, digital still cameras, TV sets, viewfinder-type or monitor-direct-view-type video tape recorders, car navigation systems, pagers, electronic notebooks, electronic calculators, word processors, work stations, videophones, POS terminals, and touch panel apparatuses without limiting to the cellular phone.

What is claimed is:

1. An organic electroluminescent device comprising:
a substrate;
a planarizing layer made of an organic material on the substrate;
a pixel electrode disposed on the planarizing layer;
an inorganic partition disposed on the planarizing layer so as to cover the upper edge of the pixel electrode and having a first aperture in which the planarizing layer is exposed;
an organic partition disposed on the inorganic partition, in contact with the planarizing layer through the first aperture;
an inorganic protective layer covering the organic partition and having a second aperture in which the organic partition is exposed;
an organic luminescent layer disposed on the pixel electrode; and
a cathode disposed on the organic luminescent layer.

2. The organic electroluminescent device according to claim 1, wherein the second aperture is formed in a region corresponding to the upper surface of the organic partition.

3. The organic electroluminescent device according to claim 1, wherein the second aperture covers at least part of the first aperture when viewing the substrate from above.

4. The organic electroluminescent device according to claim 1, wherein the inorganic protective layer mainly contains a compound selected from the group consisting of SiO, $SiO_2$, SiON, SiN, AlO, AlN, and $Al_2O_3$.

5. The organic electroluminescent device according to claim 1, wherein the inorganic protective layer has a thickness in the range of 50 to 200 nm.

6. The organic electroluminescent device according to claim 1, wherein the organic luminescent layer is formed by a gas phase process.

* * * * *